Jan. 16, 1968 R. T. ROGERS 3,364,441

LOW FREQUENCY TRANSISTOR RELAXATION OSCILLATOR

Filed March 7, 1966

INVENTOR.
ROLAND T. ROGERS
BY
Samuelson & Jacob
ATTORNEYS

United States Patent Office 3,364,441
Patented Jan. 16, 1968

3,364,441

LOW FREQUENCY TRANSISTOR RELAXATION OSCILLATOR

Roland T. Rogers, West Milford, N.J., assignor to Elastic Stop Nut Corporation of America, Union, N.J., a corporation of New Jersey Filed Mar. 7, 1966, Ser. No. 532,163
10 Claims. (Cl. 331—111)

ABSTRACT OF THE DISCLOSURE

A low frequency oscillator having a timing circuit which includes a capacitor that charges to a predetermined potential in a time period $T_1$, after which a monostable circuit is triggered to turn on a reset transistor for discharging said capacitor. The monostable circuit has a time constant such that said capacitor is discharged to and held at ground zero for a time period $T_2$ which is much shorter than time period $T_1$. The frequency of the oscillator is adjustable at said timing circuit, and the output is obtained from said monostable circuit.

The invention relates to low frequency oscillators and in particular to those oscillators which are adjustable and may be used in the range from one cycle per second to 200 cycles per second.

Often, accurate, low frequency, adjustable oscillators are required for use in connection with timing or counter circuits such as have been described in my copending application, Ser. No. 391,104, filed Aug. 21, 1964, assigned to the assignee hereof. Moreover, it is often necessary to change the oscillator frequency depending upon the particular use to which the oscillator is being put.

Thus, one oscillator can then cover a frequency ratio of 200 to one and thereby perform the functions of more than one oscillator. In programs such as telemetry this is important since the oscillator frequency may be varied as the system goes through a sequence of events. Moreover, the continuously variable adjustment provides a device which can be set to exactly the frequency desired without affecting the accuracy.

To obtain such accuracy, it is necessary that there be a well-defined triggering level, at which point the output pulse is generated. Furthermore, the duration of the output pulse must be controlled by the circuit parameters and be long enough to keep the charging wave form at ground zero for a sufficient period of time.

It is an important object of the invention to provide an accurate, low frequency, adjustable oscillator which may be used as the input to a magnetic core counter or timing circuit.

It is a further object of the invention to provide such an oscillator which has a well-defined triggering level and a detecting level which is better than has been attainable heretofore.

It is a still further object of the invention to provide such an oscillator wherein the frequency is adjustable over a range of the order of 200 to 1 by means of a single, adjustable resistor.

It is a still further object of the invention to provide such an oscillator wherein a reset means is utilized to force a short recovery time.

It is a still further object of the invention to provide such an oscillator having a circuit having the configuration of a differential amplifier and a single shot, monostable, trigger circuit in which the circuit having the configuration of a differential amplifier is used as a switching circuit for timing the operation of the oscillator and is independent of the monostable, trigger circuit when the frequency control resistance is changed.

These and other objects, features and uses will be apparent during the course of the following description when taken in conjunction with the accompanying drawings wherein.

Figure 1:
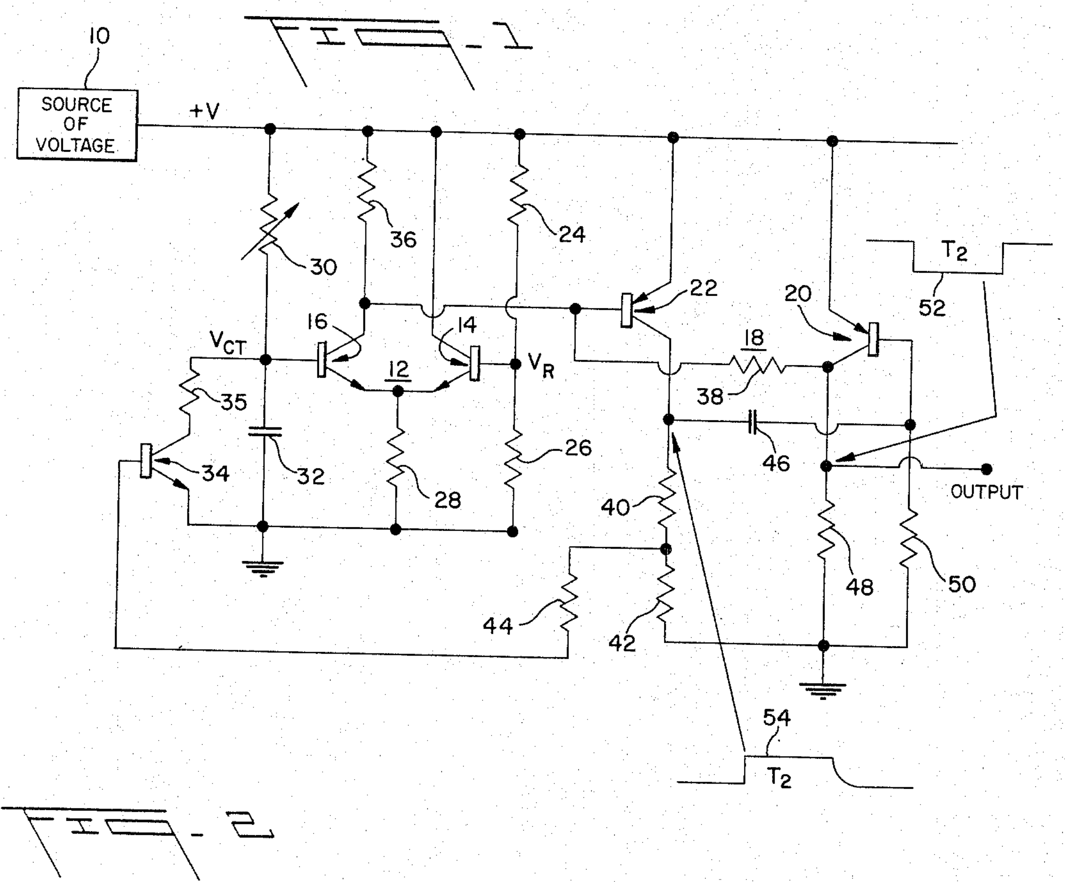
FIGURE 1 is a schematic diagram of a preferred embodiment of the low frequency, adjustable oscillator of the invention.

In the drawings, wherein, for the purpose of illustration, is illustrated a preferred embodiment of the invention and wherein like numerals are employed to designate like parts throughout the same, the numeral 10 designates a source of voltage. Source of voltage 10 should preferably deliver a direct-current voltage which is regulated in a manner well-known in the art to minimize voltage fluctuations.

Circuit 12 is a switching circuit having the configuration of a differential amplifier comprised of a pair of transistors 14 and 16 which are matched and of the same conductive type. These transistors are preferably of the N-P-N type but they may be of the P-N-P type.

Circuit 18 is a single shot, monostable, trigger circuit comprised of a pair of transistors whose conductivity type is complementary to that of transistors 14 and 16.

Resistors 24 and 26 should be matched and of as low a value of resistance as possible to ensure that the voltage $V_R$, which is less than the applied voltage (preferably, for example, about ½ the applied voltage), will appear at the base of transistor 14 when the circuit starts operating.

When voltage is first applied from the source of voltage 10, the voltage $V_R$ appears at the base of transistor 14 and voltage $+V(2V_R)$ appears at its collector. This transistor 14 and places the voltage $V_R$ at the common junction of the emitters of transistors 14 and 16.

At the same time, the voltage across capacitor 32 is zero which back biases the emitter of transistor 16 and renders transistor 16 nonconductive. At the same time, transistor 20 conducts because resistor 50 provides a path of current from source of voltage 10 to ground. Since transistor 20 is saturated to $+V$ at its collector and is coupled through resistor 38 to the base of transistor 22, transistor 22 is rendered nonconductive. Reset transistor 34 is of the same conductivity type as transistors 14 and 16 (N-P-N) and is also nonconductive because there is no current flow through resistors 40 and 44 and therefore there is no voltage applied to the base of transistor 34.

Figure 2:
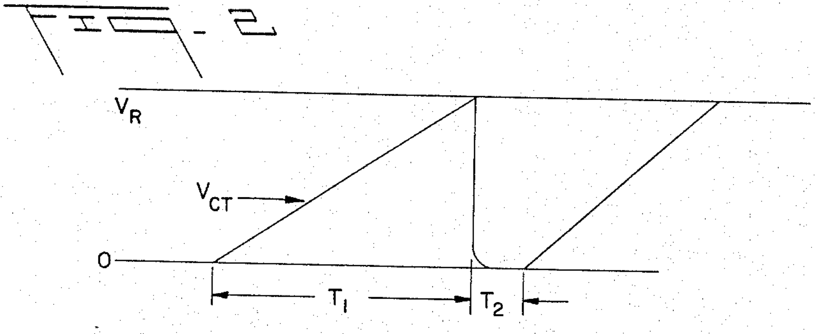
FIGURE 2 is a plot of the wave form generated in the circuit of FIGURE 1.

Now, capacitor 32 starts to charge along the curve $V_{CT}$ illustrated in FIGURE 2. When $V_{CT}=V_R$, the base-emitter junction of transistor 16 is forward biased due to the current flow in the circuit made up of resistor 36, transistor 16 and resistor 28. This renders transistor 14 nonconductive because the junction of the emitters of transistors 14 and 16 is more positive than $V_R$. The voltage drop across resistor 36 forward biases the base-emitter junction of transistor 22 so that it conducts and current flows through resistors 40, 42 and 44. The change in voltage across resistor 40 is coupled through capacitor 46 to the base of transistor 20, making transistor 20 nonconductive. Resistor 48 is the collector resistor for transistor 20.

Figure 3:
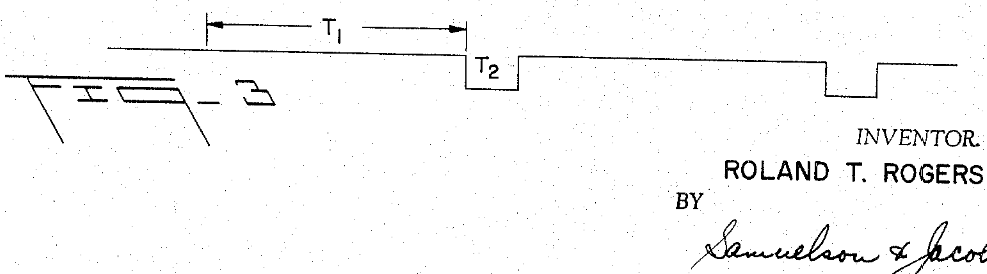
FIGURE 3 is a plot of the wave form at the output of the circuit of FIGURE 1 which output pulses may be used as timed counting pulses.

Transistor 20 remains nonconductive for the duration of time determined by the time constant of the circuit of capacitor 46 and resistor 50 ($T_2$). The current flow through resistors 40 and 44, while transistor 22 is conducting, forward biases the base of tranisitor 34 to thereby cause transistor 34 to conduct. Resistor 35 is a limiting resistor to limit the current flow through transistor 34 and prevent its being burned out due to an excessive current flow. Now, transistor 34 discharges capacitor 32 through the collector-emitter path of the transistor and $V_{CT}$ falls rapidly to ground zero (FIGURE 2). Transistor 34 continues to conduct and hold the signal at ground zero for the time ($T_2$) set by capacitor 46 and resistor 50, during which time current flows from capacitor 46 through resistor 50 to ground. During time $T_2$, a signal of the shape of wave form 54 appears at the junction of capacitor 46 and resistor 40 and a signal of the shape of wave form 52 appears at the output. The shape of the output wave form is also illustrated in FIGURE 3.

When capacitor 46 is fully discharged, transistor 34 stops conducting and the circuit goes back to the starting condition to start the next cycle.

Time $T_2$ is much smaller than time $T_1$ (of the order of 5000 to 1). However, time $T_2$ must be long enough to keep the pulse at ground zero for sufficient time (determined by the time constant of the circuit of capacitor 46 and resistor 50) to ensure that the voltage on capacitor 32 is returned to ground zero before a new cycle commences.

Resistor 30 and capacitor 32 which together constitute a timing circuit should be of high quality and possess good temperature characteristics to keep the cycles uniform. By adjusting resistor 30, the frequency of the oscillator is adjusted. As the value of resistor 30 is raised, the oscillator frequency is lowered and as its value is lowered, the oscillator frequency is raised.

Resistor 28 should have a value of at least about 20 times the value of resistor 24 or resistor 26 to stabilize the circuit against variations in frequency due to changes in temperature.

Oscillators of the type of the invention have a frequency range of the order of 200 to 1 and may easily be adjusted from about 1 cycle per second to about 200 cycles per second.

While a particular embodiment of the invention has been shown and described, it is apparent to those skilled in the art that modifications are possible without departing from the spirit of the invention or the scope of the subjoined claims.

The embodiments of the invention in which an exclusive property or privilege is claimed are defined as follows:

1. A low frequency oscillator comprising:
a source of voltage;
a first pair of transistors connected as a switching circuit such that one of said transistors is not conducting when the other of said transistors is conducting;
a first resistor and a first capacitor connected in series between the source of voltage and ground;
the junction between said first capacitor and said first resistor being connected to the switching circuit;
a second pair of transistors of a conductivity type complementary to that of the first pair of transistors connected to a series circuit comprised of a second resistor and a second capacitor so as to form a single shot, monostable, trigger circuit;
the switching circuit and the single shot, monostable, trigger circuit being connected such that only one of each pair of transistors is conductive at any given instant;
a reset transistor of the same conductivity type as that of the first pair of transistors connected to the single shot, monostable, trigger circuit and across the first capacitor such that it serves to discharge the first capacitor when the reset transistor is conducting current due to the current flow from the second capacitor through the second resistor to ground.

2. A low frequency oscillator as described in claim 1 wherein the first resistor is adjustable so that the frequency of the oscillator is adjustable.

3. A low frequency oscillator as described in claim 2 wherein two matched resistors are connected in series between the source of voltage and ground and the junction of the two matched resistors is connected to the base of one of the first pair of transistors to thereby apply initial voltage to the base of said transistor and render the said transistor conductive.

4. A low frequency oscillator as described in claim 3 wherein the first pair of transistors and the reset transistor are of the N-P-N type and the second pair of transistors is of the P-N-P type.

5. A low frequency oscillator as described in claim 3 wherein the time constant of the circuit comprising the second resistor and the second capacitor is long enough to keep the voltage across the first capacitor at ground zero before a new cycle commences.

6. A low frequency oscillator as described in claim 2 wherein the time constant of the circuit comprising the second resistor and the second capacitor is long enough to keep the voltage across the first capacitor at ground zero before a new cycle commences.

7. A low frequency oscillator as described in claim 2 wherein the first pair of transistors and the reset transistor are of the N-P-N type and the second pair of transsistors is of the P-N-P type.

8. A low frequency oscillator as described in claim 1 wherein the first pair of transistors and the reset transistor are of the N-P-N type and the second pair of transistors is of the P-N-P type.

9. A low frequency oscillator as described in claim 1 wherein the time constant of the circuit comprising the second resistor and the second capacitor is long enough to keep the voltage across the first capacitor at ground zero before a new cycle commences.

10. A low frequency oscillator as described in claim 6 wherein two matched resistors are connected in series between the source of voltage and ground and the junction of the two matched resistors is connected to the base of the first of the first pair of transistors to thereby apply initial voltage to the base of said transistor and render the said transistor conductive and including:
a third resistor connected between the junction of the emitters of the first pair of transistors and ground, said third resistor having at least about 20 times the resistance of one of the two matched resistors to stabilize the circuit against variations in frequency due to changes in temperature;
a fourth resistor connected between the source of voltage and the collector of the second of the first pair of transistors to cause a voltage drop to forward bias one of the second pair of transistors when the second of the first pair of transistors is conducting current;
a fifth resistor connected between the collector of the first and the base of the second of the second pair of transistors to render said second transistor nonconductive when said first transistor is conducting current;
the time constant of the circuit comprising the second resistor and the second capacitor being long enough to keep the voltage across the first capacitor at ground zero before a new cycle commences.

References Cited

UNITED STATES PATENTS

| | | | |
|---|---|---|---|
| 3,122,652 | 2/1964 | Kobbe et al. | 331—111 X |
| 3,156,875 | 11/1964 | Fiorino et al. | 331—111 |

ROY LAKE, *Primary Examiner.*

S. H. GRIMM, *Assistant Examiner.*

UNITED STATES PATENT OFFICE

CERTIFICATE OF CORRECTION

Patent No. 3,364,441 January 16, 1968

Roland T. Rogers

It is hereby certified that error appears in the above numbered patent requiring correction and that the said Letters Patent should read as corrected below.

Column 1, line 41, for "continuouly" read -- continuously --; column 2, line 24, for "conductive" read -- conductivity --; line 37, after "This" insert -- condition forward biases the base-emitter junction of --; column 3, line 23, after "32" insert a comma; line 24, after "circuit" insert a comma.

Signed and sealed this 1st day of April 1969.

(SEAL)
Attest:

Edward M. Fletcher, Jr.
Attesting Officer

EDWARD J. BRENNER
Commissioner of Patents